United States Patent
Gopalraja et al.

[11] Patent Number: 6,042,700
[45] Date of Patent: Mar. 28, 2000

[54] ADJUSTMENT OF DEPOSITION UNIFORMITY IN AN INDUCTIVELY COUPLED PLASMA SOURCE

[75] Inventors: Praburam Gopalraja, Sunnyvale; Murali Narasimhan, San Jose, both of Calif.

[73] Assignee: Applied Materials, Inc., Santa Clara, Calif.

[21] Appl. No.: 08/929,829

[22] Filed: Sep. 15, 1997

[51] Int. Cl.[7] ................................................. C23C 14/34
[52] U.S. Cl. .......................... 204/192.15; 204/192.12; 204/192.3
[58] Field of Search ................ 204/192.12, 192.15, 204/192.3, 298.08, 298.12, 298.13

[56] References Cited

U.S. PATENT DOCUMENTS

| | | | |
|---|---|---|---|
| 3,594,295 | 7/1971 | Meckel et al. | 204/192 |
| 4,336,118 | 6/1982 | Patten et al. | 204/192 EC |
| 4,362,632 | 12/1982 | Jacob | 422/183.04 |
| 4,441,974 | 4/1984 | Nishikawa et al. | 204/192 R |
| 4,495,221 | 1/1985 | Broadbent | 427/88 |
| 4,626,312 | 12/1986 | Tracy | 156/345 |
| 4,661,228 | 4/1987 | Mintz | 204/192.25 |
| 4,692,230 | 9/1987 | Nihei et al. | 204/192.31 |
| 4,716,491 | 12/1987 | Ohno et al. | 361/230 |
| 4,717,462 | 1/1988 | Homma et al. | 204/298 |
| 4,731,172 | 3/1988 | Adachi et al. | 204/192.26 |
| 4,756,815 | 7/1988 | Turner et al. | 204/298 |
| 4,792,732 | 12/1988 | O'Loughlin | 315/334 |
| 4,810,342 | 3/1989 | Inoue | 204/192.17 |
| 4,816,126 | 3/1989 | Kamoshida et al. | 204/192.3 |
| 4,818,723 | 4/1989 | Yen | 437/200 |
| 4,824,544 | 4/1989 | Mikalesen et al. | 204/298 |
| 4,842,703 | 6/1989 | Class et al. | 204/192.12 |
| 4,844,775 | 7/1989 | Keeble | 156/643 |
| 4,865,712 | 9/1989 | Mintz | 204/298 |
| 4,871,421 | 10/1989 | Ogle et al. | 156/643 |
| 4,897,709 | 1/1990 | Yokoyama et al. | 357/68 |
| 4,918,031 | 4/1990 | Flamm et al. | 437/225 |

(List continued on next page.)

FOREIGN PATENT DOCUMENTS

| | | | |
|---|---|---|---|
| 0520519 | 12/1992 | European Pat. Off. | H01J 37/32 |
| 0607797 | 1/1994 | European Pat. Off. | H01J 37/32 |
| 0807954 | 5/1997 | European Pat. Off. | H01J 37/34 |
| 0836219 | 10/1997 | European Pat. Off. | H01J 37/34 |
| 56-56722 | 5/1981 | Japan | B21C 37/06 |
| 59-190363 | 10/1984 | Japan | C23C 15/00 |
| 61-190070 | 8/1986 | Japan | C23C 14/34 |
| 5152248 | 1/1991 | Japan | H01L 21/285 |

(List continued on next page.)

OTHER PUBLICATIONS

Singapore Search Report in Application No. 9704107–3 filed Nov. 20, 1997.

Search Report issued in PCT/US98/18898 filed Sep. 9, 1998.

M. Yamashita, "Sputter Type High Frequency Ion Source for Ion Beam Deposition Apparatus," *Jap. J. Appl. Phys.*, vol. 26, pp. 721–727, 1987.

(List continued on next page.)

*Primary Examiner*—Nam Nguyen
*Assistant Examiner*—Steven H. VerSteeg
*Attorney, Agent, or Firm*—Charles S. Guenzer

[57] ABSTRACT

A plasma chamber in a semiconductor fabrication system uses a two step process to sputter deposit material onto a substrate. The first step provides a power ratio of RF power to DC power optimized to increase uniformity of deposition of material onto a workpiece from a first target. A second step involves applying little to no DC power to the target, while an RF power is coupled into a plasma generation region to sputter material from a second target onto the workpiece. It has been found that material from the second target provides greater sidewall coverage of channels located on the workpiece, as well as increasing the uniformity of the deposit on the surface of the workpiece.

21 Claims, 5 Drawing Sheets

U.S. PATENT DOCUMENTS

| | | | |
|---|---|---|---|
| 4,925,542 | 5/1990 | Kidd | 204/192.31 |
| 4,941,915 | 7/1990 | Matsuoka et al. | 204/298.12 |
| 4,944,961 | 7/1990 | Lu et al. | 427/38 |
| 4,948,458 | 8/1990 | Ogle | 156/643 |
| 4,970,176 | 11/1990 | Tracy et al. | 437/187 |
| 4,990,229 | 2/1991 | Campbell et al. | 204/298.06 |
| 4,999,096 | 3/1991 | Nihei et al. | 204/192.3 |
| 5,065,698 | 11/1991 | Koike | 118/719 |
| 5,091,049 | 2/1992 | Campbell et al. | 156/643 |
| 5,094,885 | 3/1992 | Selbrede | 427/248.1 |
| 5,122,251 | 6/1992 | Campbell et al. | 204/298.06 |
| 5,135,629 | 8/1992 | Sawada et al. | 204/192.12 |
| 5,146,137 | 9/1992 | Gesche et al. | 315/111.21 |
| 5,169,684 | 12/1992 | Takagi | 427/248.1 |
| 5,171,412 | 12/1992 | Talieh et al. | 204/192.15 |
| 5,175,608 | 12/1992 | Nihei et al. | 257/751 |
| 5,178,739 | 1/1993 | Barnes et al. | 204/192.12 |
| 5,186,718 | 2/1993 | Tepman et al. | 29/25.01 |
| 5,192,371 | 3/1993 | Shuto et al. | 118/728 |
| 5,206,516 | 4/1993 | Keller at al. | 250/492.2 |
| 5,213,650 | 5/1993 | Wang et al. | 156/345 |
| 5,223,112 | 6/1993 | Tepman | 204/298.11 |
| 5,225,740 | 7/1993 | Ohkawa | 315/111.41 |
| 5,228,501 | 7/1993 | Tepman | 165/80.1 |
| 5,231,334 | 7/1993 | Paranjpe | 315/111.21 |
| 5,234,560 | 8/1993 | Kadlec et al. | 204/192.12 |
| 5,238,499 | 8/1993 | van de Ven et al. | 118/724 |
| 5,241,245 | 8/1993 | Barnes et al. | 315/111.41 |
| 5,280,154 | 1/1994 | Cuomo et al. | 219/121.52 |
| 5,292,393 | 3/1994 | Maydan et al. | 156/345 |
| 5,304,279 | 4/1994 | Coultas et al. | 156/345 |
| 5,312,717 | 5/1994 | Sachdev et al. | 430/313 |
| 5,320,728 | 6/1994 | Tepman | 204/192.12 |
| 5,330,628 | 7/1994 | Demaray et al. | 204/192.12 |
| 5,346,578 | 9/1994 | Benzing et al. | 156/345 |
| 5,360,996 | 11/1994 | Nulman et al. | 257/767 |
| 5,361,016 | 11/1994 | Ohkawa et al. | 315/111.41 |
| 5,366,590 | 11/1994 | Kadomura | 156/662 |
| 5,368,685 | 11/1994 | Kumihashi et al. | 156/643 |
| 5,397,962 | 3/1995 | Moslehi | 315/111.51 |
| 5,404,079 | 4/1995 | Ohkuni et al. | 315/111.81 |
| 5,418,431 | 5/1995 | Williamson et al. | 315/111.51 |
| 5,421,891 | 6/1995 | Campbell et al. | 118/723 R |
| 5,427,668 | 6/1995 | Sato et al. | 204/298.05 |
| 5,429,070 | 7/1995 | Campbell et al. | 118/723 R |
| 5,429,710 | 7/1995 | Akiba et al. | 216/17 |
| 5,429,995 | 7/1995 | Nishiyama et al. | 437/238 |
| 5,430,355 | 7/1995 | Paranjpe | 315/111.21 |
| 5,431,799 | 7/1995 | Mosley et al. | 204/298.06 |
| 5,443,995 | 8/1995 | Nulman | 437/197 |
| 5,503,676 | 4/1996 | Shufflebotham et al. | 118/723 MR |
| 5,573,595 | 11/1996 | Dible | 118/723 MP |
| 5,639,357 | 6/1997 | Xu | 204/192.3 |
| 5,707,498 | 1/1998 | Ngan | 204/192.12 |
| 5,830,331 | 11/1998 | Kim et al. | 204/192.15 |

FOREIGN PATENT DOCUMENTS

| | | | |
|---|---|---|---|
| 5-129276 | 5/1993 | Japan | H01L 21/31 |
| 5-148644 | 6/1993 | Japan | C23C 14/44 |
| 6232055 | 8/1994 | Japan | H01L 21/205 |
| 6283470 | 10/1994 | Japan | H01L 21/302 |
| 7176398 | 7/1995 | Japan | H05H 1/46 |
| 7176399 | 7/1995 | Japan | H05H 1/46 |
| 8153712 | 6/1996 | Japan | C23F 4/00 |
| 8288259 | 11/1996 | Japan | C23F 4/00 |
| 2162365 | 1/1986 | United Kingdom | H01J 27/02 |
| 2231197 | 11/1990 | United Kingdom | H01J 37/32 |
| WO860623 | 11/1986 | WIPO | H05H 1/46 |

OTHER PUBLICATIONS

M. Yamashita, "Fundamental Characteristics of Built–in High Frequency Coil Type Sputtering Apparatus," *J. Vac. Sci. Technol.*, vol. A7, pp. 151–158, 1989.

S.M. Rossnagel et al., "Metal Ion Deposition from Ionized Magnetron Sputtering Discharge," *J. Vac. Sci. Technol.*, vol. B12, pp. 449–453, 1994.

S.M. Rossnagel et al., "Magnetron Sputter Deposition with High Levels of Metal Ionization," *Appl. Phys. Lett.*, vol. 63, pp. 3285–3287, 1993.

S.M. Rossnagel, et al., "Filling Dual Damascene Interconnect Structures with AlCu and Cu Using Ionized Magnetron Deposition," *J. Vac. Sci. Technol.*, vol. B13, pp. 125–129, 1995.

Y–W. Kim et al., "Directed Sputter Deposition of AlCu: Film Microstructure and Chemistry," *J. Vac. Sci. Technol.*, vol. A12, pp. 3169–3175, 1994.

J. Hopwood et al., "Mechanisms for Highly Ionized Magnetron Sputtering," *J. Appl. Phys.*, vol. 78, pp. 758–765, 1995.

P. Kidd, "A Magnetically Confined and ECR Heated Plasma Machine for Coating and Ion Surface Modification Use," *J. Vac. Sci. Technol.*, vol. A9, pp. 466–473, 1991.

W.M. Holber, et al., "Copper Deposition by Electron Cyclotron Resonance Plasma," *J. Vac. Sci. Technol.*, vol. A11, pp. 2903–2910, 1993.

S.M. Rossnagel, "Directional and Ionized Sputter Deposition for Microelectronics Applications," *Proc. of 3rd ISSP* ( Tokyo ), pp. 253–260, 1995.

M. Matsuoka et al., Dense Plasma Production and Film Deposition by New High–Rate Sputtering Using an Electric Mirror, *J. Vac. Sci. Technol.*, A 7 (4), 2652–2657, Jul./Aug. 1989.

N. Jiwari et al., "Helicon wave plasma reactor employing single–loop antenna," *J. of Vac. Sci. Technol.*, A 12(4), pp. 1322–1327, Jul./Aug. 1994.

Search report dated Feb. 27, 1997, EPC application No. 96308251.6.

U.S. application No. 08/461,575, filed Sep. 30, 1992, pending (Atty. Dk. 364.F1).

U.S. application No. 08/733,620, filed Oct. 17, 1996, pending (Attorney Docket # 1457/PVD/DV).

U.S. application No. 08/730,722, filed Oct. 8, 1996, pending (Aty. Dk. 1207/MD/PVD/DV).

Demaray et al., "Aluminum Alloy Planarization for Topography Control of Multilevel VLSI Interconnect," Proceedings—VLSI and Computers: First International Conference on Computer Technology, Systems and Applications, May 11, 1987.

Park et al., "Influences of D.C. Bias on Aluminum Films Prepared with a High Rate Magnetron Sputtering Cathode," Thin Solid Films, 1985.

Hoffman, "Practical Troubleshooting of Vacuum Deposition Processes and Equipment for Aluminum Metallization," Solid State Technology, vol. 21, No. 12, pp. 47–56, Dec. 12, 1978.

Hoffman, "Tungsten Titanium Diffusion Barrier Metallization, "Solid State Technology, vol. 26, No. 6, pp. 119–126, Jun. 6, 1983.

Hoffman et al., "Planarization of Aluminum Alloy Films During High Rate Sputtering," Thin Solid Films, vol. 153, pp. 369–377, Oct. 26, 1987.

Ahn et al., Effects of Substrate Temperature on Copper Distribution, Resistivity, and Microstructure in Magnetron–Sputtered Al–Cu Films, Thin Solid Films, vol. 153, pp. 409–419, Oct. 26, 1987.

Helmer et al., "Pressure Effects in Planar Magnetron Sputter Deposition," Journal of Vacuum Science & Technology A (Vacuum, Surfaces, and Films), vol. 4, No. 3, pt. 1, pp. 408–412, May–Jun., 1986.

Skelly et al., "Significant Improvement in Step Coverage Using Bias Sputter Aluminum," J. Vac. Sci. Technol., 1986.

Joshi et al., Collimated Sputtering of TiN/Ti Liners into Sub–Half Micron High Aspect Ratio Contacts/Lines, Jun. 9–10, 1992 VMIC Conference 1992, pp. 253–259.

Meikle et al., "Semiconductor Process Considerations for Collimated Source Sputtering of Ti Films," Jun. 9–10, 1992 VMIC Conference, 1992, pp. 289–291.

Van Gogh et al., "Characterization of Improved TiN Films by Controlled Divergence Sputtering," Jun. 9–10, 1992 VMIC Conference, 1992, pp. 310–313.

U. S. Serial No. 08/789,960 (Atty. Dkt. 1643).

U.S. application No. 08/753,251, filed Nov. 21, 1996, pending (Aty. Dk. 1657/PVD/DV).

|  | Etch Step Interval 1 | | Center Thick Step Interval 2 | | Edge Thick Step Interval 3 | |
|---|---|---|---|---|---|---|
|  | Standard Range | Optimum Range | Standard Range | Optimum Range | Standard Range | Optimum Range |
| DC Power | 0 - 1 kW | 0.5 kW | 3 - 5 kW | 4 kW | 0 - 1 kW | 0 kW |
| RF Power | 1.5 - 3 kW | 2.5 kW | 1.5 - 3 kW | 2.5 kW | 1.5 - 3 kW | 2.5 kW |
| Pressure | 15 - 30 mT | 25 mT | 25 - 45 mT | 30 mT | 15 - 45 mT | 30 mT |
| Pedestal Bias | -40 to -100V | -80 V | 0 to -40 V | -20 V | 0 to -40 V | -20 V |
| Time | 5 - 10 seconds | | 20 seconds | | 20 seconds | |

Fig. 3

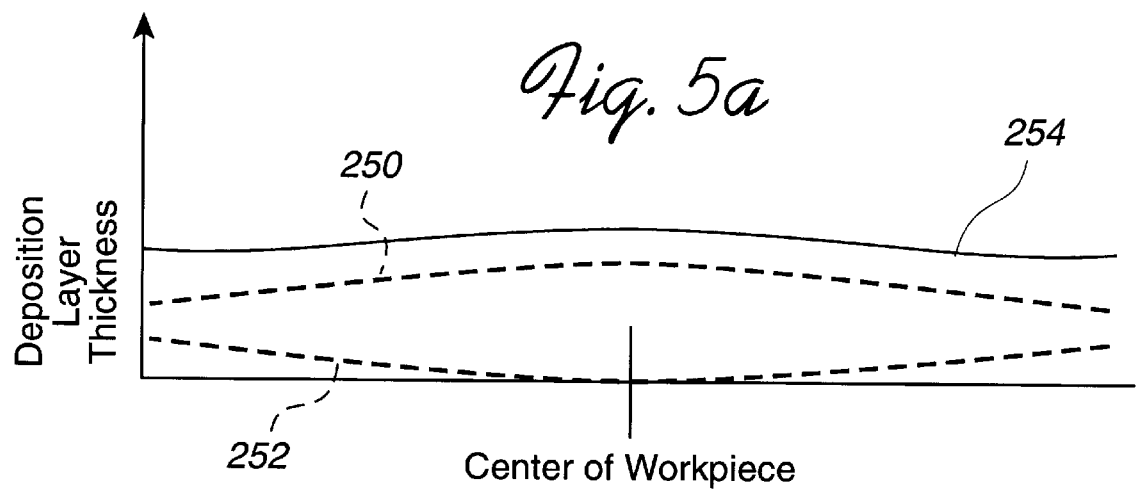
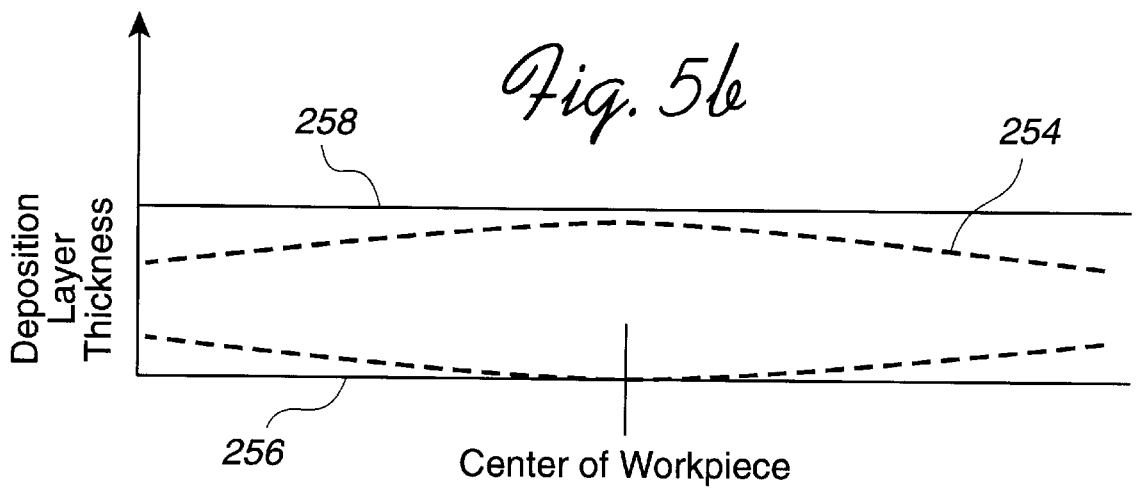

ADJUSTMENT OF DEPOSITION UNIFORMITY IN AN INDUCTIVELY COUPLED PLASMA SOURCE

FIELD OF THE INVENTION

The present invention relates to plasma generators, and more particularly, to a method and apparatus for generating a plasma to sputter deposit a layer of material in the fabrication of semiconductor devices.

BACKGROUND OF THE INVENTION

Plasmas have become convenient sources of energetic ions and activated atoms which can be employed in a variety of semiconductor device fabrication processes including surface treatments, depositions, and etching processes. For example, to deposit materials onto a semiconductor wafer using a sputter deposition process, a plasma is produced in the vicinity of a sputter target material which is negatively biased. Ions created adjacent to the target impact the surface of the target to dislodge, i.e., "putter" material from the target. The sputtered materials are then transported and deposited on the surface of the semiconductor wafer.

Sputtered material has a tendency to travel in straight line paths from the target to the substrate being deposited, at angles which are oblique to the surface of the substrate. As a consequence, materials deposited in etched trenches and holes of semiconductor devices having trenches or holes with a high depth to width aspect ratio, can bridge over causing undesirable cavities in the deposition layer. To prevent such cavities, the sputtered material can be redirected into substantially vertical paths between the target and the substrate by negatively charging the substrate to position vertically oriented electric fields adjacent the substrate if the sputtered material is sufficiently ionized by the plasma. However, material sputtered in a low density plasma often has an ionization degree of less than 10% which is usually insufficient to avoid the formation of an excessive number of cavities. Accordingly, it is desirable to increase the density of the plasma to increase the ionization rate of the sputtered material in order to decrease the formation of unwanted cavities in the deposition layer. As used herein, the term "dense plasma" is intended to refer to one that has a high electron and ion density.

There are several known techniques for exciting a plasma with RF fields including capacitive coupling, inductive coupling and wave heating. In a standard inductively coupled plasma (ICP) generator, RF current passing through a coil surrounding the plasma induces electromagnetic currents in the plasma. These currents heat the conducting plasma by ohmic heating, so that it is sustained in steady state. As shown in U.S. Pat. No. 4,362,632, for example, current through a coil is supplied by an RF generator coupled to the coil through an impedance matching network, such that the coil acts as the first windings of a transformer. The plasma acts as a single turn second winding of a transformer.

A high density plasma typically requires the chamber to be operated at a relatively high pressure. As a result, the frequency of collisions between the plasma ions and the deposition material atoms is increased and the scattering of the deposition atoms is likewise increased. This scattering of the deposition atoms typically causes the thickness of the deposition layer on the substrate to be thicker on that portion of the substrate aligned with the center of the target and thinner in the outlying regions. Such nonuniformity of deposition is often undesirable in the fabrication of semiconductor devices.

SUMMARY OF THE PREFERRED EMBODIMENTS

It is an object of the present invention to provide an improved method and apparatus for generating a plasma within a chamber and for sputter-depositing a layer which obviate, for practical purposes, the above-mentioned limitations.

These and other objects and advantages are achieved by, in accordance with one aspect of the invention, a sputtering apparatus which deposits ionized sputtered deposition material in two different intervals distinguished by the amount of material sputtered from a primary target as compared to material sputtered from a secondary target disposed around the substrate. In the illustrated embodiment, in a first interval, RF power is applied to a coil inductively coupled into a high density plasma and DC power is applied to a planar sputtering target. In this first interval, a substantial amount of material is sputtered from both the planar target and the coil (the secondary target) although material is sputtered primarily from the planar target (the primary target). It has been found that uniformity may be further improved by, in a second interval, reducing or eliminating the DC power supplied to the planar target while a level of RF power is still applied to the coil. Under these conditions, material is sputtered primarily from the coil rather than target. Because the coil may be positioned closer to the workpiece periphery, the relative thickness of deposition material deposited toward the periphery of the workpiece may be increased further relative to the deposition in the center of the workpiece. As a consequence, the tendency of the target to deposit material more thickly in the center of the workpiece may be offset by sputtering primarily from the coil in the second interval. Still further, improved sidewall coverage of channels located on the workpiece surface may be achieved in the second interval because the material sputtered from the coil tends to have a greater horizontal velocity component than the material sputtered from the target.

BRIEF DESCRIPTION OF THE DRAWINGS

FIG. 3 is a table illustrating examples of various intervals of a process of operating a plasma generating chamber in accordance with an embodiment of the present invention.

FIG. 5a is a chart depicting the respective deposition profiles for material deposited from the target and coil of the plasma generating chamber of FIGS. 1–2 due to the RF power applied to the coil and the DC power bias of the target during the center thick step.

FIG. 5b is a chart depicting the final deposition profile of the material deposited by the plasma generating chamber of FIGS. 1–2 after all the steps and the respective deposition profiles for material deposited from the target and coil generated during the edge thick step and the center thick step.

DETAILED DESCRIPTION OF THE EMBODIMENTS

Figure 1:
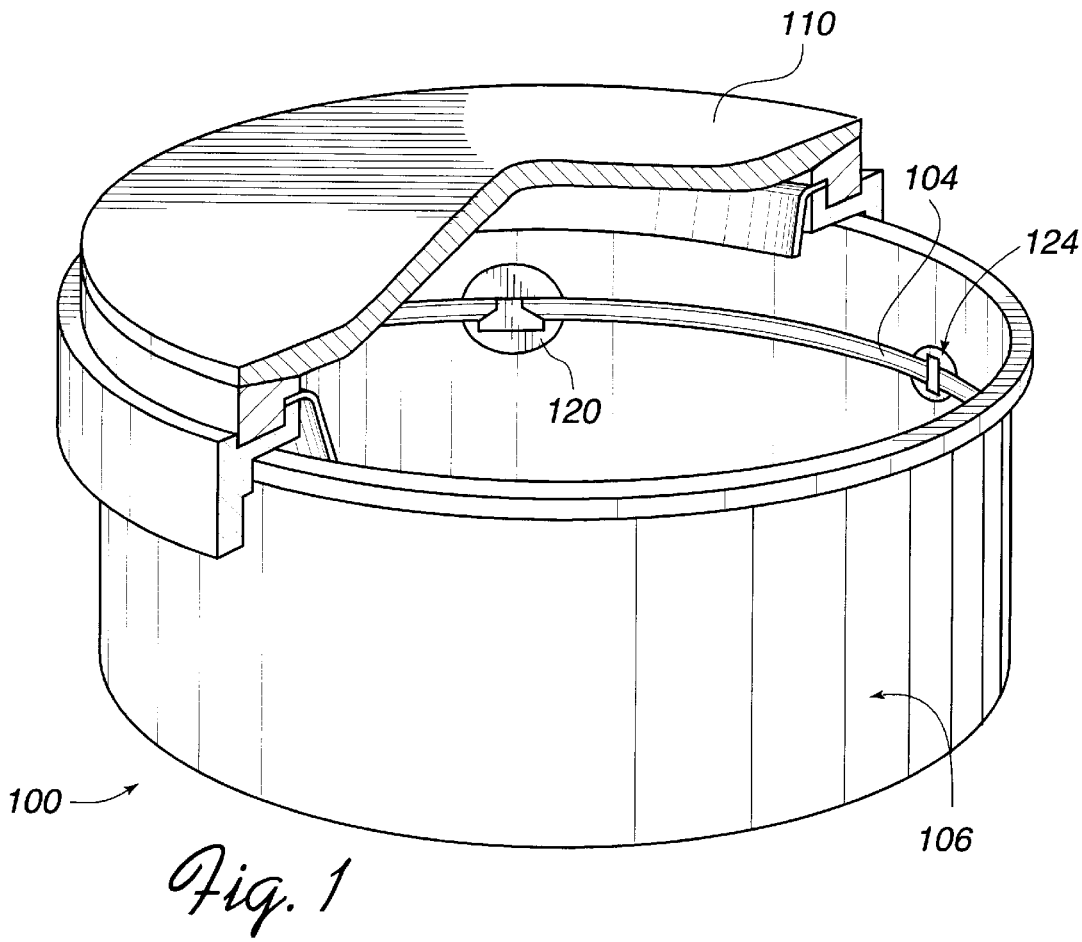
FIG. 1 is a perspective, partial cross-sectional view of a plasma generating chamber used in accordance with an embodiment of the present invention.
Figure 2:
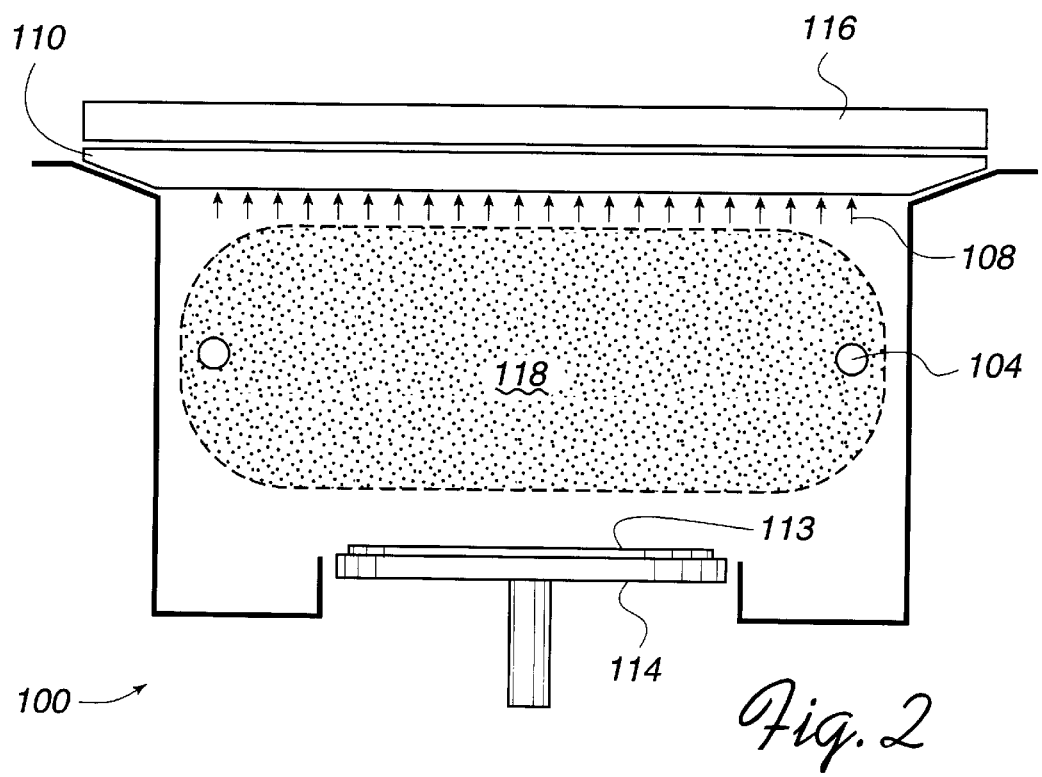
FIG. 2 is a schematic cross-sectional diagram of the plasma generating chamber of FIG. 1.

Referring first to FIGS. 1–2, a plasma generator used in accordance with an embodiment of the present invention comprises a substantially cylindrical plasma chamber 100 which is received in a vacuum chamber (not shown). The plasma chamber 100 of this embodiment has a single turn coil 104 which is carried internally of the vacuum chamber walls by a chamber shield 106. The chamber shield 106 protects the interior walls of the vacuum chamber from the material being deposited within the interior of the plasma chamber 100.

Additionally, housed inside the plasma chamber 100 is a pedestal 114 located adjacent the floor of the plasma chamber 100 and capable of supporting a substrate 112. Located above the substrate 112 adjacent the ceiling of the plasma chamber 100 is a target 110. Electrical connections, which will be described in greater detail below in connection with FIG. 4, apply DC power to the target 110 and an AC or RF power to the coil 104 and RF induced bias to the substrate 112.

In a preferred embodiment, the plasma generator sputter deposits material from a target 110 onto a substrate 112 in two steps. In the first step, the deposition profile tends to be thicker in the center of the substrate 112 and therefore is referred to herein as a "center thick step." Conversely, in the second step referred to herein as an "edge thick step," the deposition profile tends to be thicker toward the periphery of the substrate 112 so as to compensate for the center thick tendency of the "center thick step." As discussed below, the order of the two steps are interchangeable, and furthermore, the two steps can be preceded by an optional third step referred to herein as an "etch step."

In the center thick step, DC power is applied to bias the target 110. Thereby, an ion flux 108 (FIG. 2), created by a rotating magnetron assembly 116, is attracted by the negatively biased target 110 to strike the surface of the target 110. The ion flux 108 is able to eject material from the target 110 onto a substrate 112 which may be a wafer or other workpiece supported by the pedestal 114 at the bottom of the plasma chamber 100. The magnetron assembly 116 (shown schematically in FIG. 2) produces magnetic fields which are swept over the face of the target 110 to promote uniform erosion by sputtering of the target 110.

Additionally, in the center thick step, radio frequency (RF) energy is radiated from the coil 104 into the interior of the plasma chamber 100, which energizes a plasma 118 (FIG. 2) within the plasma chamber 100. Deposition material sputtered from the target 110 is ionized by the plasma 118 so that the ionized material may be attracted to the substrate 112 by electric fields in the vicinity of the substrate 112. These electric fields are oriented so as to direct the ionized deposition material in directions generally orthogonal to the surface of the substrate 112 to improve the step coverage of vias, channels and other high aspect ratio structures.

In order to accommodate the coil 104 to facilitate ionization of the plasma, it has been found beneficial to space the target 110 from the surface of the workpiece 112. However, this increased spacing between the target and the workpiece can adversely impact the uniformity of the material being deposited from the target. Such nonuniformity typically exhibits itself as a thickening of the deposited material toward the center of the workpiece with a consequent thinning of the deposited material toward the edges of the workpiece as represented by deposition profile 250 in FIG. 5a.

As set forth in copending application Ser. No. 08/680,335, filed Jul. 10, 1996, now abandoned, (Atty. Docket 1390CIP/PVD/DV) incorporated herein by reference in its entirety, this nonuniformity may be compensated by sputtering deposition material not only from the sputter target 110 above the workpiece but also from a coil or other secondary target encircling the edges of the workpiece. Here, because the edges of the workpiece are closer to the coil 104 than is the center of the workpiece, any material sputtered from the coil-shield 104 may tend to deposit more thickly toward the edges of the workpiece than the center as represented by deposition profile 252. This is generally the reverse of the deposition pattern 250 of material from the target 110. By appropriately adjusting the ratio of RF power level applied to the coil-shield 104 to the DC power level of the bias applied to the target, the deposition level of the material being sputtered from the coil-shield 104 may be selected in such a manner as to compensate substantially for the non-uniformity of the deposition profile of the material from the target such that the overall deposition profile 254 of the layer from both sources of sputtered can be substantially more uniform than that which has often been obtained from the overhead target alone.

It is presently believed that the amount of sputtering which will originate from the coil 104 as compared to the sputtering which originates from the target 110 may be a function of the RF power applied to the coil 104 relative to the DC power applied to the target 110. By adjusting the ratio of the coil RF power to the target DC power, the relative amounts of material sputtered from the coil 104 and the target 110 may be varied so as to improve uniformity. It is believed that a particular ratio of the coil RF power to the target DC power will achieve the smallest degree of non-uniformity of the layer of material deposited from both the coil and the target. As the RF power to the coil is increased relative to the DC power applied to the target, the deposited layer tends to be more edge thick. Conversely, by decreasing the ratio of the RF power to the coil relative to the DC power applied to the target, the center of the deposited layer tends to grow increasingly thicker relative to the edges. Thus, by adjusting the ratio of the RF power to the coil relative to the DC power biasing the target, the material being sputtered from the coil can be increased or decreased as appropriate to compensate for non-uniformity of the material being deposited from the target to achieve a more uniform deposited layer comprising material from both the target and the coil. For the coil 104, a coil RF power to target DC power ratio of approximately 0.7 may provide satisfactory results on an 8 inch diameter wafer.

It is further believed that the relative amounts of sputtering between the coil and the target may also be a function of the DC biasing of the coil 104 relative to that of the target 110. This DC biasing of the coil-shield 104 may be adjusted in a variety of methods. For example, a matching network 402 and blocking impedance 406 (FIG. 4) coupled to the coil 104 typically comprise one or more inductors and capacitors. By varying the impedance of one or more these inductors and capacitors, the DC biasing of the coil-shield 104 might be adjusted to achieve the desired level of uniformity. In one embodiment, the RF power to the coil and the DC biasing of the coil-shield 104 may have separate adjustment inputs to achieve the desired results. For example, AC or DC biasing sources could be coupled through RF filters to the coil. An alternative power arrangement could include two RF generators operated at slightly different frequencies. The output of one generator would be coupled to the coil in the conventional manner but the other generator at the slightly different frequency would be capacitively coupled to the coil such that a change in the power level of the second generator would change the DC bias of the coil. Such an arrangement could provide independent control of the RF power and DC bias applied to the coil. At present, it is believed that relatively large changes in DC bias to the coil for a given RF power level would be necessary to have a substantial effect on the amount of material sputtered from the coil.

By adjusting various parameters including the coil bias level and the ratio of the coil RF power to the target DC power, the relative amounts of material sputtered from the target 110 and the coil 106 may be varied so as to achieve improved uniformity. As shown in FIG. 3, exemplary power ranges employed during the center thick step include 3–5 kW for DC power to the target and 1.5–3 kW for RF power applied to the coil. Within these ranges, a 4 kW value for DC power and a 2.5 kW value for RF power can provide good results, depending upon the application.

The optimal power ratio and the values of other parameters will vary depending upon the particular application including the particular sizes of the chamber, coil, target and substrate, their relative spacings, sputter gas pressure, sputter material and other variables well known to those skilled in the art.

However, in many applications the coil power cannot be increased beyond a certain value due to hardware limitations. For example, the current carrying capabilities of the coil 104 may limit the amount of RF power which may be applied to the coil without causing damage to the coil. In other applications, varying impedances or coupling a bias source to the coil in addition to an RF source may not be appropriate. As a result, in some applications, the desired degree of uniformity might not be readily achievable by balancing the application of RF power to the coil and DC power to the target or otherwise modifying the coil bias level.

Therefore, in accordance with one aspect of the present invention, a second step may be advantageously employed during deposition to increase uniformity on the surface of the substrate 112 even further. In this additional step, referred to herein as an "edge thick step," the application of DC power to the target 110 is reduced or eliminated, while RF power to the coil 104 is maintained uninterrupted at a preset level to maintain the high density plasma 118 which continues to ionize the sputtered material prior to deposition on the substrate. However, because the DC power to the target 110 is eliminated or at least decreased relative to RF power applied to the coil 104, the positively charged ions begin to strike primarily the coil 104 rather than the target 110. Consequently the ionized material deposited onto the substrate 112 is sputtered primarily if not entirely from the coil 104 rather than the target 110 during this second step.

In the illustrated embodiment, the coil 104 is supported by the shield 106 (FIG. 1) so that the coil 104 encircles the substrate 112 (FIG. 2) in a position which is above and recessed outwardly from the periphery of the substrate 112 as schematically represented in FIG. 2. As a result, the coil 104 is closer to the periphery than the center of the substrate. Consequently material sputtered from the coil 104 has a greater likelihood of depositing near the periphery of the substrate as opposed to the center of the substrate. By turning off the power to the target 110 during the deposition so that most of the sputtered material originates from the coil 104 rather than the target 110, the deposition profile can be switched from a center thick profile as represented by the profile 254 (FIG. 5b) discussed above to an edge thick profile as represented by the deposition profile 256. This edge thick profile 256 of the second step (target power turned off) can offset or compensate for a center thick tendency 254 of the first step (target power turned on). Consequently, the actual overall deposition profile 258 which is a combination of the deposition profiles 254 and 256 can be more uniform than the deposition profile 254 alone.

As shown in FIG. 3, exemplary ranges employed during the edge thick step include 0–1 kW for DC power and 1.5–3 kW for RF power. Within these ranges, a value for DC power of 0 kW and a value for RF power of 2.5 kW can produce an edge thick profile deposition in the second step which can substantially offset a center thick tendency of the deposition profile of the first step.

In a preferred embodiment, the DC power to the target 110 is shut off completely (represented as 0 kW in FIG. 3) while the RF power to the coil is maintained during the edge thick step such that the sputtered material comes almost entirely from the coil 104. However, the target 110 has a tendency to self bias itself even without any DC power being applied. Thus, some sputtering of material from the target 110 biasing may still occur during the edge thick step.

Figure 6A:
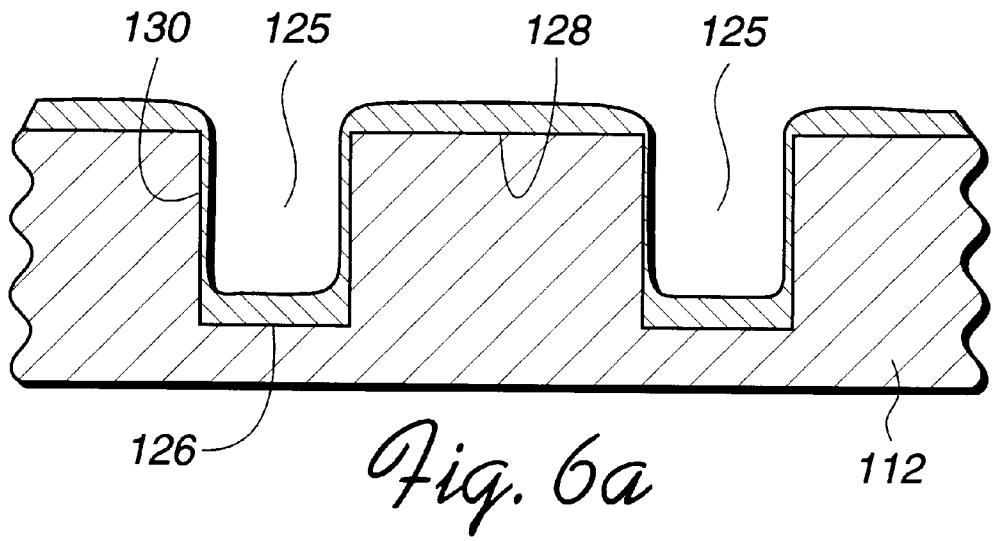
FIGS. 6a–6c are cross-sectional views of a channel of the workpiece as sputtered material is deposited during various intervals.

In addition to improving the uniformity of deposition over the entire substrate, the aforementioned multi-step process can also improve sidewall coverage of vias, channels and other structures having vertical surfaces. This may be understood by referring to FIG. 6a which illustrates the deposition coverage for a plurality of channels 125, which may result during that portion of the deposition in which the target 110 predominates, that is, the center thick step. As illustrated in FIG. 6a, the center thick step can provide good coverage of the horizontal surfaces of the channels 125 such as the bottom walls 126 as well as the center portions 128 of the surface of the substrate 112 separating the channels. However, because of the ionization of the deposition material which causes the material to travel more vertically, the deposition upon vertical surfaces, such as the sidewalls 130 of the channels 125, may be substantially thinner. If the sidewall coverage is too thin, it can interfere with the operation of the deposited layer. This is particularly true for deposited titanium underlayers.

On the other hand, where the deposition material originates primarily from the coil 104, the "edge thick" step, the sidewall coverage may be improved. It is believed that because the coil 104 is not positioned directly above the substrate 112, the sputtered material from the coil tends to strike the substrate 102 at angles that are more acute than the material from the target 110 which is positioned directly above the substrate. In effect, the horizontal velocity component of the material sputtered from the coil 104 is often much greater than the horizontal velocity component of the material sputtered from the target 110. As a result, the sputtered material from the coil 104 can provide improved coverage of the sidewalls 130 of the channels 125 as well as a smoothing effect on the surface of the substrate 112.

Figure 6B:
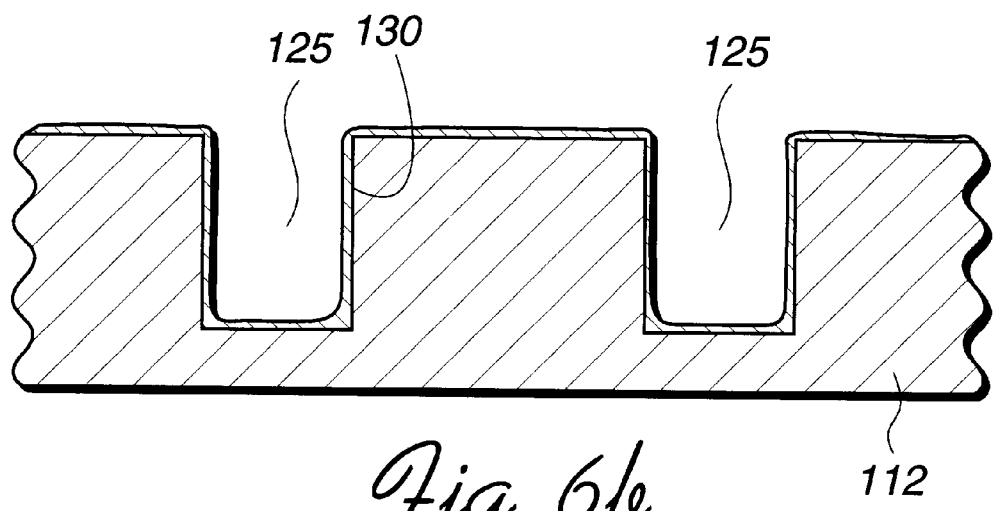
Figure 6C:
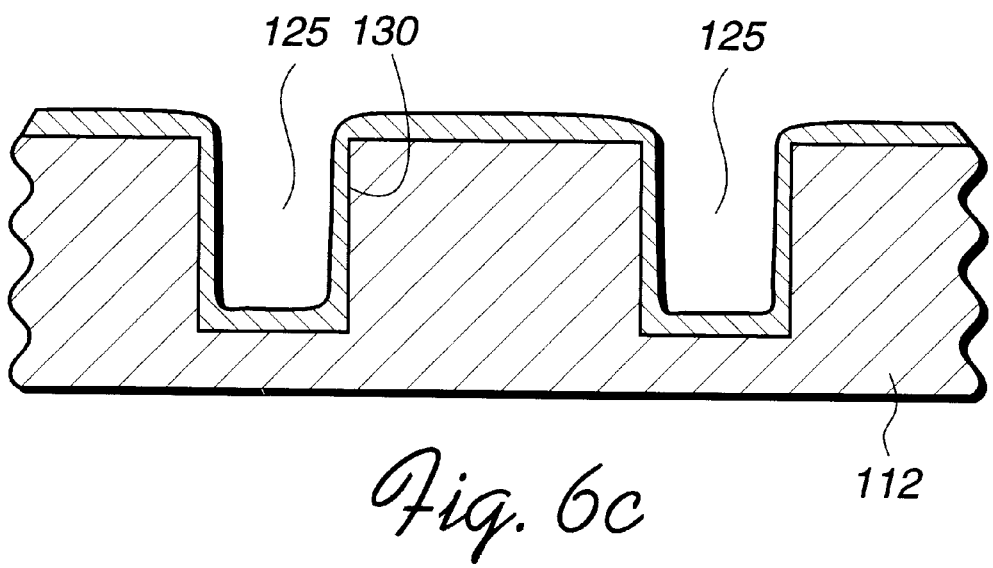

FIG. 6b illustrates the deposition coverage which may result during a deposition step in which sputtering from the coil predominates. As shown therein, the deposition rates for material deposited on the vertical surfaces 130 of the channels 125 relative to the deposition rates for material deposited on the horizontal surfaces 126, 128 tend to be more even when sputtering from the coil predominates as compared to the corresponding deposition rates for material deposited when sputtering from the target 110 predominates (FIG. 6a). In most applications the total quantity of material sputtered from the target 110 and deposited on the substrate will be substantially greater than the total quantity of material sputtered from the coil 104 and deposited onto the substrate. Thus, by adding a deposition step in which sputtering from the coil predominates by reducing or eliminating the application of a bias to the target 110 the amount of material deposited on the vertical surfaces relative to the that deposited on the horizontal surfaces can be increased. Thus, the combined effects of the two steps can provide more uniform deposition on the surface of the substrate 112 as well as good sidewall 130 and bottom coverage of the channels 125 as illustrated in FIG. 6c.

In another embodiment, the two step deposition process can be preceded by an optional etching step. In this step, a strong bias may be applied to the pedestal 114 while applying RF power to the coil 104. This RF bias applied to the pedestal 114 induces a correspondingly strong bias on the substrate 112. At the same time, a relatively low DC bias is applied to the target 110. If the bias induced on the substrate is made sufficiently high, more ions can be attracted to the surface of the substrate 112 as compared to the surfaces of the target 110 and the coil 104. The net effect of the etch step can be to have more material sputtered from the surface of the substrate 112 than is being deposited on the substrate 112 from the coil and target. As a result, the material can be removed from the surface of the substrate 112 in order to clean the contacts, and prepare the substrate 112 for the subsequent sputter deposition of the center thick and edge thick steps discussed above.

The negative bias applied to the pedestal 114 to induce net etching of the substrate will vary depending upon the particular application. In general, the pedestal bias during the etching step will be substantially higher than that of the deposition steps in which the substrate bias primarily is intended to aid in achieving good bottom coverage of the substrate channels rather than to enhance etching of the substrate. In the illustrated embodiment as shown in FIG. 3, a suitable pedestal bias is −80 V, for example, and may range from −40 to −100 V, for example, during the etching step. By comparison, the pedestal bias in FIG. 3 for the center thick and edge thick deposition steps is preferably less negative, such as −20 V, for example, and may range from 0 to −40 V, for example.

The RF power applied to the coil 104 may be maintained relatively constant during each of the etching and deposition steps as shown in FIG. 3 because good ionization is useful not only during the etching step but also during the deposition steps for good bottom coverage. As set forth above, a suitable RF power level for the coil is 2.5 kW, for example, and may range from 1.5 to 3 kW, for example. On the other hand, the DC power applied to the target may be substantially reduced during the etching step as compared to the deposition steps in order to reduce the sputtering level of the target during substrate etching. In the illustrated embodiment, a suitable target DC power level is 0.5 kW, for example, and may range from 0–1 kW, for example, during the etching step. By comparison, the DC power applied to the target may be substantially increased, such as to 4 kW, for example, to substantially increase target sputtering during the center thick step, and may be substantially reduced or eliminated to 0 kW, for example, to reduce or eliminate target sputtering during the edge thick deposition step, as discussed above.

The chamber pressure level may be maintained at a relatively constant level during each of the etching and deposition steps. However, because sputtering of the target and coil may be at a relatively low rate during etching of the substrate, the chamber pressure may be reduced during the etching step. Thus, as shown in FIG. 3, the chamber pressure may be maintained at a pressure value of 25 mT, for example, during the etching step and raised to a somewhat higher level to 30 mT, for example, during deposition steps to facilitate ionization of the sputtered material.

The duration of each step will of course depend upon a number of factors including the material being deposited, deposition rates, and desired etching depths and deposition thicknesses. Exemplary durations for the etching step may range from 5–10 seconds, for example and the duration of the center thick and edge thick depositions may approximate 20 seconds, for example.

Figure 4:
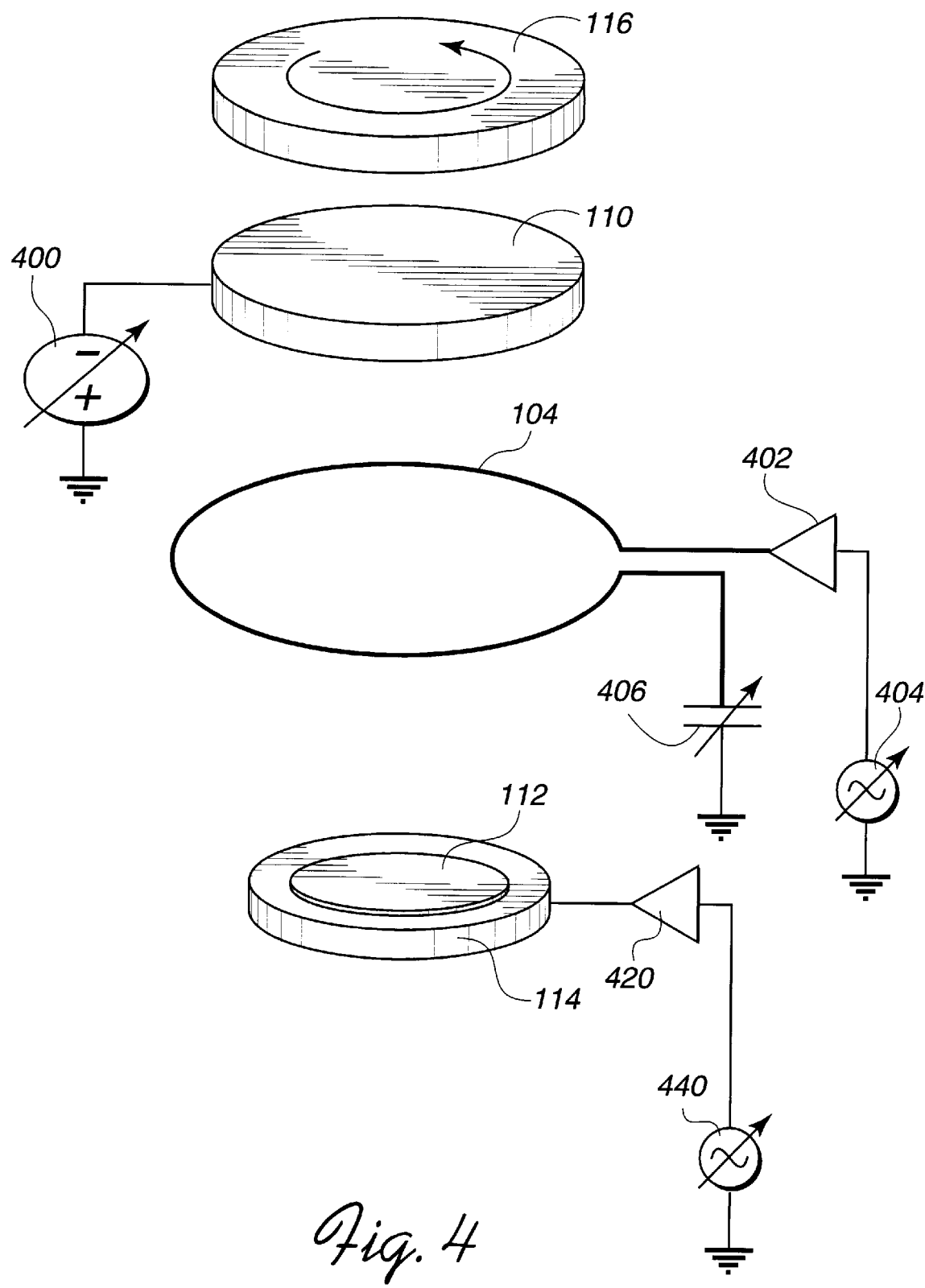
FIG. 4 is a schematic diagram of the electrical interconnections to the plasma generating chamber of FIGS. 1–2.

FIG. 4 includes a schematic representation of the electrical connections of the plasma generating apparatus of this illustrated embodiment. To sputter target material onto the substrate 112, the target 110 is preferably negatively biased by a variable DC power source 400 to attract the ions of the ion flux 108. The pouwer source 400, and the other power sources discussed below, are preferably controlled by a microprocessor based workstation which is programmed to implement the processes described herein.

The pedestal 114 may be negatively biased by a variable DC, AC or RF power source 440 to bias the substrate 112 negatively to attract the ionized deposition material to the substrate 112. FIG. 3 discloses the bias applied to the pedestal during the various time intervals. As shown in FIG. 3, during the center thick and edge thick steps, the exemplary range employed for the pedestal bias is 0 to −40 V, and the exemplar value is −20 V. The pedestal bias during the etch step was discussed above. As shown in FIG. 3, if the pedestal 114 is biased by a high frequency RF power source, one end of the pedestal 114 may be coupled to the output of an amplifier and matching network 420, the input of which is coupled to an RF generator 440. External biasing of the pedestal 114 and the substrate 112 of greater than about 50 V in absolute value, relative to the ground, may increase sputtering (and resputtering) of the substrate 112, and thereby further promote deposition uniformity. In yet another alternative embodiment, an external biasing of the substrate 112 may be omitted. For example, the substrate 112 may develop a self-biasing of between about −5 V to about −10 V relative to the ground, even in the absence of any external biasing.

One end of the coil 104 is coupled to an RF source such as the output of an amplifier and matching network 402, the input of which is coupled to an RF generator 404. The other end of the coil 104 is coupled to ground, preferably through a blocking capacitor 406, which may be a variable capacitor. In addition, as described in copending application Ser. No. 08/907,382 filed Aug. 7, 1997 pending entitled "Plasma Vapor Deposition with Coil Sputtering" (Attorney Docket 1957/PVD/DV) and incorporated herein by reference in its entirety, a separate DC bias source may be coupled to the coil through an RF filter to permit control of coil sputtering rate independently of RF power levels to the coil. Hence, RF power to the coil may be reduced or eliminated in some or all steps.

The coil 104 is carried on the chamber shield 106 by a plurality of coil standoffs 120 (FIG. 1) which electrically insulate the coil 104 from the supporting chamber shield 106. In addition, the insulating coil standoffs 120 have an internal labyrinth structure which permits repeated deposition of conductive materials from the target 110 onto the coil standoffs 120 while preventing the formation of a complete conducting path of deposited material from the coil 104 to the chamber shield 106. Such a completed conducting path is undesirable because it could short the coil 104 to the chamber shield 106 (which is typically grounded).

RF power is applied to the coil 104 by feedthrough bolts which are supported by insulating feedthrough standoffs 124 (FIG. 1). The feedthrough standoffs 124, like the coil support standoffs 120, permit repeated deposition of conductive material from the target onto the feedthrough standoff 124 without the formation of a conducting path which could short the coil 104 to the chamber shield 106. The coil feedthrough standoff 124, like the coil support standoff 120, has an internal labyrinth structure to prevent the formation of a short between the coil 104 and the wall of the shield 106. The feedthrough is coupled to the RF generator 404 (shown schematically in FIG. 4) through the matching network 402 (also shown schematically in FIG. 4).

The target 110 may be composed of different materials, such as aluminum, titanium, or copper. It generally has the shape of a cylindrical disk as seen in FIGS. 1, 2 and 4. However, other design shapes for the target 110 are, of course, possible, and may lead to different deposition profiles for the material deposited from the target onto the substrate. For example, a secondary annular target (of titanium, aluminum or other suitable materials) may be positioned around the periphery of the substrate, to supplement the material being sputtered from a primary planar target onto the substrate, with the primary planar target positioned above the substrate. Each target which is negatively biased should be electrically insulated from the vacuum chamber which is typically grounded.

The coil 104 of the embodiment illustrated in FIGS. 1–2 is made of approximately 50 mm (2 inch) by approximately 1.6 mm (1/16 inch) heavy-duty bead-blasted solid high-purity (preferably 99.995% pure) titanium or copper ribbon formed into a single turn helical coil having a diameter of about 290 mm (11.5 inches). However, other highly conductive materials and shapes may be utilized depending upon the material being sputtered and other factors. For example, the ribbon may be as thick as 3 mm (1/8 inch). Also, if the material to be sputtered is aluminum, both the target and the coil should be made of high-purity aluminum. In addition to the ribbon shape illustrated, hollow tubing may be utilized, particularly if water cooling is desired.

Several of the embodiments discussed above utilized a single coil 104 with a single turn in the plasma chamber 100. It should be recognized that the present invention is applicable to plasma chambers having a multiple turn RF coil. The advantage of a multiple turn coil is that the required current levels can be substantially reduced for a given RF power level. However, multiple turn coils tend to be more complicated and hence most costly and difficult to clean as compared to single turn coils. For example, a three turn helical coil of titanium and its associated supporting structure could be quite expensive. The coil may have shapes other than helical such as spiral, for example.

It should also be recognized that the present invention is applicable to plasma chambers having more than one RF powered coil. For example, the present invention may be applied to multiple coil chambers for launching helicon waves of the type described in copending application Ser. No. 08/559,345, filed Nov. 15, 1995 pending for "Method and Apparatus for Launching a Helicon Wave in a Plasma" which is assigned to the assignee of the present application and is incorporated herein by reference.

The appropriate RF generators and matching circuits are components well known to those skilled in the art. For example, an RF generator such as the ENI Genesis series which has the capability to "frequency hunt" for the Lest frequency match with the matching circuit and antenna is suitable. The frequency of the generator for generating the RF power to the coil 104 is preferably 2 MHz but it is anticipated that the range can vary from, for example, 1 MHz to 4 MHz.

In the illustrated embodiments above, the chamber shield 106 has a diameter of 400 mm (16"), but it is anticipated that satisfactory results can be obtained with a diameter in the range of 150–635 mm (6"–25"). The chamber shield 106 may be fabricated from a variety of materials including insulative materials such as ceramics or quartz. However, the chamber shield 106 and all metal surfaces likely to be coated with the target material are preferably made of a material such as stainless steel or copper, unless made of the same material as the sputtered target material. The material of the structure which will be coated should have a coefficient of thermal expansion which closely matches that of the material being sputtered to reduce flaking of sputtered material from the chamber shield 106 or other structure onto the substrate 112. In addition, the material to be coated should have good adhesion to the sputtered material. Thus for example if the deposited material is titanium, the preferred metal of the chamber shield 106, standoffs 120 and 124 and other structures likely to be coated is bead-blasted titanium. Any surfaces which are more likely to sputter, such as the end caps of the coil and feedthrough standoffs 120 and 124, would preferably be made of the same type of material as the target 110, such as high-purity, bead-blasted titanium, for example. Of course, if the material to be deposited is a material other than titanium, the preferred metal is the deposited material, stainless steel, for example. Adherence can also be improved by coating the structures with molybdenum prior to sputtering the target 110. However, it is preferred that the coil 104 (or any other surface likely to sputter) not be coated with molybdenum or other materials since the molybdenum can contaminate the substrate 112 if sputtered from the coil 104.

The substrate 112 to target 110 spacing is in a range of about 120–150 mm, preferably about 140 mm (about 5.5"), but can also range from about 38 to 200 mm (1.5" to 8"). For this wafer to target spacing, suitable stepped wafer bottom coverage may be achieved with a coil diameter of 290 mm (11.5 inches) spaced from the target by a distance of approximately 50 mm (1.9 inches). It has been found that increasing the diameter of the coil which moves the coil away from the workpiece edge may have an adverse effect on bottom coverage. On the other hand, decreasing the coil diameter to move the coil closer to the wafer edge can adversely affect layer uniformity.

Deposition uniformity also appears to be a function of coil spacing from the target. As previously mentioned, a spacing of 50 mm (1.9 inches) between the coil and target may be found satisfactory for a target to wafer spacing of 140 mm. Moving the coil vertically either toward or away from the target (or wafer) can adversely affect deposition layer uniformity.

A variety of precursor gases may be utilized to generate the plasma including Ar, $H_2, O_2$ or reactive gases such as $NF_3$, $CF_4$ and many others. Various precursor gas pressures are suitable including pressures of 0.1–50 mTorr which includes the exemplar pressures set forth in FIG. 3. However, pressures between 10 mTorr and 50 mTorr facilitate ionization of sputtered material.

It will, of course, be understood that modifications of the present invention, in its various aspects, will be apparent to those skilled in the art, some being apparent only after study, others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. A method of sputter depositing material onto a workpiece in a sputter reactor, comprising:

in a first interval, spultering material primarily from a first, disk-shaped target, thereby depositing sputtered material from said first target onto said workpiece; and in a second interval, sputtering material primarily from a second, ring-shaped target which is a coil coupling RF energy, thereby depositing sputtered material from said second target onto said workpiece.

2. A method of sputter depositing material onto a workpiece, comprising:

in a first interval, sputtering material primarily from a first target in a plasma energized by RF energy radiated by a coil, thereby depositing sputtered material from said first target onto said workpiece; and in a second interval, sputtering material primarily from said coil, thereby depositing sputtered material from said coil onto said workpiece.

3. The method of claim 2 wherein, in said first interval, said first target is DC biased by a DC power supply.

4. The method of claim 2 wherein said second interval occurs after said first interval.

5. The method of claim 2 wherein said first interval occurs after said second interval.

6. The method of claim 2 further comprising, in a third interval preceding said first and second intervals, etching said workpiece by biasing said workpiece and applying RF energy to said coil to produce ions to strike the surface of said workpiece to clean contacts located on said workpiece.

7. The method of claim 2 wherein said coil includes a coil material, and said target includes a target material, wherein said target material and said coil material are the same type of material.

8. The apparatus of claim 2 wherein said target includes titanium, and wherein said coil includes titanium.

9. The apparatus of claim 2 wherein said target includes aluminum, and wherein said coil includes aluminum.

10. The apparatus of claim 2 wherein said target includes copper, and wherein said coil includes copper.

11. A method of sputter depositing material onto a workpiece, the method comprising:

in a first interval, biasing a target arranged about a chamber axis and positioned above said workpiece to attract ions to sputter material from said target and applying RF energy to a coil to energize a plasma of said ions;

in a second interval, terminating said biasing of said target while applying RF energy to said coil; and in a third interval preceding said first and second intervals, etching said workpiece by biasing said workpiece and applying RF energy to said coil to produce ions to strike the surface of said workpiece to clean contacts located on said workpiece.

12. The method of claim 11 wherein, in said first interval, said first target is DC biased by a DC power supply.

13. The method of claim 11 wherein said coil includes a coil material and said target includes a target material, wherein said target material and said coil material are the same type of material.

14. A method of depositing sputtered material onto a workpiece within a semiconductor fabrication system having a target powered by a first power source and a coil powered by a second power source, the method comprising:

a first step of depositing sputtered material from both said coil and said target onto said workpiece in a first interval in which material is sputtered primarily from said target; and a second step of depositing sputtered material from said coil onto said workpiece in a second interval in which material is sputtered primarily from said coil.

15. The method of claim 14 wherein said second interval occurs after said first interval.

16. The method of claim 14 wherein said first interval occurs after said second interval.

17. The method of claim 14 further comprising, prior to said first and second steps, applying RF energy from said second power source to said coil, thereby etching said workpiece to clean contacts located on said workpiece.

18. A method practiced in a DC plasma sputtering chamber of sputtering a material from a target onto a wokpiece supported on a pedestal, an induction coil comprising said material being wrapped within the chamber around a plasma generation region, said method comprising a first step and a second step being alternately performed while said workpiece is disposed in said chamber;

wherein said first step comprises applying a first DC level of DC power to said target and a first RF level of RF power to said coil;

wherein said second step comprises applying a second DC level of DC power less than said first DC level to said target and a second RF level of RF power to said coil; and whereby said first step preferentially deposits said material at a center of said workpiece and said second step preferentially deposits said material at a periphery of said workpiece.

19. The method of claim 18, wherein said second DC level is approximately zero.

20. The method of claim 19, wherein said first and second RF levels are substantially equal.

21. The method of claim 20, further comprising electrically biasing said pedestal negative string said first and second steps.

* * * * *